United States Patent
Hackenschmied et al.

(10) Patent No.: US 8,920,686 B2
(45) Date of Patent: Dec. 30, 2014

(54) RADIATION CONVERTER MATERIAL, RADIATION CONVERTER, RADIATION DETECTOR, USE OF A RADIATION CONVERTER MATERIAL AND METHOD FOR PRODUCING A RADIATION CONVERTER MATERIAL

(75) Inventors: Peter Hackenschmied, Nürnberg (DE); Christian Schröter, Bamberg (DE); Matthias Strassburg, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 727 days.

(21) Appl. No.: 13/016,016

(22) Filed: Jan. 28, 2011

(65) Prior Publication Data

US 2011/0186788 A1  Aug. 4, 2011

(30) Foreign Application Priority Data

Feb. 1, 2010 (DE) .......... 10 2010 006 452

(51) Int. Cl.
| | |
|---|---|
| H01B 1/06 | (2006.01) |
| H01L 31/0296 | (2006.01) |
| H01L 31/0272 | (2006.01) |
| H01L 31/0264 | (2006.01) |
| H01L 31/115 | (2006.01) |
| G01T 1/24 | (2006.01) |

(52) U.S. Cl.
CPC ............ *G01T 1/24* (2013.01); *H01L 31/115* (2013.01)
USPC ............. 252/519.4; 252/519.14; 252/519.13; 252/500; 252/478; 438/510; 250/370.09

(58) Field of Classification Search
CPC ........... H01L 31/0296; H01L 31/0272; H01L 31/0264
USPC ........... 252/519.4, 519.14, 519.13, 500, 478; 438/510; 250/370.09
See application file for complete search history.

(56) References Cited

U.S. PATENT DOCUMENTS

| | | | |
|---|---|---|---|
| 5,512,756 A | 4/1996 | Bayer et al. | |
| 5,575,105 A | 11/1996 | Otomo | |
| 5,861,321 A | 1/1999 | Dodge | |
| 8,502,156 B2 * | 8/2013 | Hackenschmied et al. | 250/370.09 |
| 2005/0026884 A1 | 2/2005 | Ball | |
| 2005/0268841 A1 | 12/2005 | Lynn | |
| 2008/0173822 A1 * | 7/2008 | Feltgen et al. | 250/370.01 |
| 2009/0114832 A1 | 5/2009 | Ciampi | |

FOREIGN PATENT DOCUMENTS

| | | |
|---|---|---|
| CN | 1113322 A | 12/1995 |
| DE | 4344252 | 6/1995 |
| DE | 102008048303 B3 * | 4/2010 |
| EP | 2124259 A2 * | 11/2009 |
| WO | WO 2010043427 A1 * | 4/2010 |

OTHER PUBLICATIONS

Translation of EP 2124259, Nov. 25, 2009.*
DE 10 2010 006 452.1, filed Feb. 1, 2010 (not yet published).

* cited by examiner

*Primary Examiner* — Douglas Mc Ginty
(74) *Attorney, Agent, or Firm* — Harness, Dickey & Pierce, P.L.C.

(57) ABSTRACT

A radiation converter material includes a semiconductor material used for directly converting radiation quanta into electrical charge carriers. In at least one embodiment, the semiconductor material includes a dopant in a dopant concentration and defect sites produced in a process-dictated manner in such a way that the semiconductor material includes an ohmic resistivity in a range of between $5 \cdot 10^7$ $\Omega \cdot$cm and $2 \cdot 10^9$ $\Omega \cdot$cm. Such a radiation converter material is particularly well matched to the requirements in particular in human-medical applications with regard to the high flux rate present and the spectral distribution of the radiation quanta. In at least one embodiment, the invention additionally relates to a radiation converter and a radiation detector, and a use of and a method for producing such a radiation converter material.

17 Claims, 2 Drawing Sheets

RADIATION CONVERTER MATERIAL, RADIATION CONVERTER, RADIATION DETECTOR, USE OF A RADIATION CONVERTER MATERIAL AND METHOD FOR PRODUCING A RADIATION CONVERTER MATERIAL

PRIORITY STATEMENT

The present application hereby claims priority under 35 U.S.C. §119 on German patent application number DE 10 2010 006 452.1 filed Feb. 1, 2010, the entire contents of which are hereby incorporated herein by reference.

FIELD

At least one embodiment of the invention generally relates to a radiation converter material, a radiation converter and/or a radiation detector. At least one embodiment of the invention additionally relates to a use of such a radiation converter material and/or a method for producing such a radiation converter material.

BACKGROUND

So-called directly converting radiation converter materials are known for the detection of gamma or X-ray radiation. Individual quantum absorption events can be detected using such directly converting radiation converter materials. Radiation detectors based on such radiation converter materials are usually also referred to as counting detectors. The directly converting radiation converter materials are generally semiconductor materials in which gamma or X-ray radiation is converted into electrical charge carriers in a single conversion step.

A special situation is present when such a radiation converter material is used for a radiation converter or for a radiation detector for a human-medical X-ray tomography apparatus, for example of a computed tomography apparatus. Here quantum absorption events have to be detected quantitatively or in a counting fashion at comparatively high quantum flux rates of e.g. more than $10^8$ X-ray quanta/mm$^2$*s.

Limits of the quantitative detection arise on account of different boundary conditions. Radiation converter materials have defect sites, for example in the form of vacancies or interstitial atoms, in a manner governed by production. These are responsible for polarization effects that lead to a reduction of the charge carrier lifetime/mobility product ($\mu\tau$ product) and thus to an increase in the average residence duration with at the same time a reduction in the lifetime of the charge carriers in the semiconductor material. Polarization effects thus reduce the separation efficiency of the liberated charge carriers and lead to a widening of the detected electrical signal. As a result there is a risk, in particular, of signals from quanta that arrive in close temporal succession being superposed in such a way that it is no longer possible to separate the events. However, liberated charge carriers can also recombine with oppositely charged defect sites present. Depending on the charge carrier lifetime, these charge carriers are then lost for conversion into an electrical signal.

Radiation converter materials are known in which the material is doped with a dopant with the aim of minimizing the polarization effects. In this case, the doping atoms introduced are intended to passivate or compensate for the defect sites present in the crystal as completely as possible. However, this optimization approach generally leads simultaneously to an undesirable decrease in the ohmic resistivity of the radiation converter material. As a result of the high applied voltage for separating the liberated charge carriers by means of the electric field thus generated, a comparatively high dark current or leakage current is thus associated with this. This leads to a reduction of the signal-to-noise ratio. The spectral sensitivity of the radiation detector and, consequently, the detectability of low-energy X-ray quanta are greatly reduced as a result.

Taking this as a departure point, the intention is to provide a directly converting radiation converter material which is matched to a typical quantum flow in human-medical X-ray examinations with regard to rate and spectral distribution. Furthermore, the intention is to provide the corresponding radiation converter and a radiation detector. Moreover, the intention is to specify a method for producing such a radiation converter material.

SUMMARY

At least one embodiment of the invention is directed to a radiation converter material, and also by way of a radiation converter, a radiation detector and/or a method. Advantageous refinements are the subject matter of dependent claims.

The radiation converter material according to at least one embodiment of the invention comprises a semiconductor material used for directly converting radiation quanta into electrical charge carriers, the semiconductor material containing in combination a dopant in a predetermined dopant concentration and defect sites produced in a process-dictated manner in such a way that the semiconductor material has an ohmic resistivity in a range of between $5 \cdot 10^7$ Ω·cm and $2 \cdot 10^9$ Ω·cm.

In human-medical X-ray examinations, quantum fluxes typically occur with comparatively high flow rates in conjunction with a wide spectral distribution. The inventors have recognized, in particular, that an image reconstruction on the basis of detected signals with a directly converting radiation converter material in the case of such quantum fluxes leads to particularly good results in terms of the image quality only when a suitable compromise between the degree of polarization and a spectral sensitivity is chosen in the case of the semiconductor material used. Such a radiation converter material is also well suited to multiple-energy applications, in particular to dual-source systems, on account of these properties.

The radiation converter material according to at least one embodiment of the invention is therefore fully optimized neither with regard to the degree of polarization nor with regard to the spectral sensitivity. Therefore, relative to the respective optimum, a lower spectral sensitivity and a higher degree of polarization of the semiconductor material are deliberately accepted. This compromise is surprisingly readily attainable for the high-flux applications in the human-medical field when the semiconductor material has a resistivity in the specified range of values, which is brought about by a certain doping of the semiconductor material and by defect sites present in the semiconductor material. In this case, the defect sites can be produced in a targeted manner, that is to say in a specific number and/or with a specific spatial position in the semiconductor material in a process-dictated manner in the context of the production or postprocessing of the semiconductor material. Heretofore, those skilled in the art have taken the view that semiconductor materials having a resistivity of less than or equal to $2 \cdot 10^9$ Ω·cm cannot be used, in principle, for such high-flux applications on account of the low spectral resolution and the high dark currents. Known semiconductor materials therefore have an ohmic resistivity of typically $1 \cdot 10^{11}$ Ω·cm. In the case of the present invention, therefore, the solution involved deliberately acting against a prejudice prevailing among those skilled in the art.

A particularly good result of the signal detection can be obtained when the semiconductor material has an ohmic resistivity in a lower range, namely between $1 \cdot 10^8$ Ω·cm and $1 \cdot 10^9$ Ω·cm. In this resistivity range, the polarization is lower in comparison and the signal-to-noise ratio associated with the spectral sensitivity is again significantly higher.

The semiconductor material preferably has a μτ product for positive charge carriers of greater than $5 \cdot 10^{-5}$ cm²/V and for negative charge carriers of greater than $1 \cdot 10^{-3}$ cm²/V. In the case of the layer thicknesses of the semiconductor material which are necessary for the human-medical X-ray examinations, such a magnitude of the product of the charge carrier mobility μ and the charge carrier lifetime τ ensures a sufficiently good collecting quality of the radiation detector. In this context, collecting quality is understood to mean the ratio between detected charge and free charge generated by quantum absorption processes.

An important prerequisite for the operation of a counting radiation detector is an efficient interaction of atoms with the acting radiation quanta. A high atomic number is necessary for this purpose. In one preferred configuration, the semiconductor material used is a CdTe, CdZnTe, CdZnTSe or CdMnTeSe semiconductor material. To put it more precisely for example a $Cd_xZn_{1-x}Te_ySe_{1-y}$ or a $Cd_xMn_{1-x}Te_ySe_{1-y}$ system where (0≤x≤1, 0≤y≤1).

The dopant can be formed by impurities present in the semiconductor material. The basic doping undesirably present in the semiconductor material would therefore be utilized in this case. Preferably, the semiconductor material is doped in a targeted manner with a selected dopant in a predeterminable dopant concentration during the production process. The dopant used is preferably an element or a combination of the elements from the following group: F, Cl, I, Al, Ga, In, Tl, Os, Ru, Fe. These elements are readily available and can be used for doping in the known production methods without a high outlay.

It has been found that a CdTe or CdZnTe semiconductor material having a doping on the basis of a dopant comprising at least the one element Cl in a dopant concentration of less than $5 \cdot 10^{17}$ atoms/cm³ is particularly suited to the high-flux applications in the human-medical field.

A CdZnTe semiconductor material having a doping on the basis of a dopant comprising at least the one element In in a dopant concentration of less than $2 \cdot 10^{16}$ atoms/cm³ has likewise proved to be particularly good semiconductor material.

Further aspects of embodiments of the invention concern a radiation converter containing a radiation semiconductor material described above, and a radiation detector comprising such a radiation converter.

The method according to at least one embodiment of the invention for producing a radiation converter material, in which a semiconductor material is used for directly converting radiation quanta into electrical charge carriers, comprises the following method steps:
 a) the semiconductor material is doped with a dopant in a predetermined dopant concentration.
 b) afterward, depending on the dopant and/or the dopant concentration, a heat treatment of the semiconductor material for producing additional defect sites is performed in such a way that an ohmic resistivity in a range of between $5 \cdot 10^7$ Ω·cm and $2 \cdot 10^9$ Ω·cm, preferably between $1 \cdot 10^8$ Ω·cm and $1 \cdot 10^9$ Ω·cm, is obtained.

In a processing step downstream of the actual production process, therefore, in a highly targeted manner, the concentration and/or distribution of the intrinsic defect sites in the semiconductor material are set in relation to the distribution of the dopant and/or the dopant concentration by means of a corresponding heat treatment such that the resistivity of the semiconductor material lies in the resistivity range specified above.

In this case, preferably two temperature levels are traversed temporally successively for the heat treatment. At least one of the positions of the temperature levels, a time window for the heat treatment at one of the temperature levels, the surrounding atmosphere and/or a temperature gradient for attaining one of the temperature levels are set as process parameters.

In one advantageous configuration of at least one embodiment of the invention, the first temperature level is set to a temperature of between 700° C. and 1050° C. and the second temperature level is set to a temperature of between 300° C. and 420° C. These temperature levels have proved to be particularly suitable for the controlled production of defect sites.

BRIEF DESCRIPTION OF THE DRAWINGS

The invention is explained in greater detail below on the basis of example embodiments and with reference to drawings, in which.

DETAILED DESCRIPTION OF THE EXAMPLE EMBODIMENTS

Figure 1:
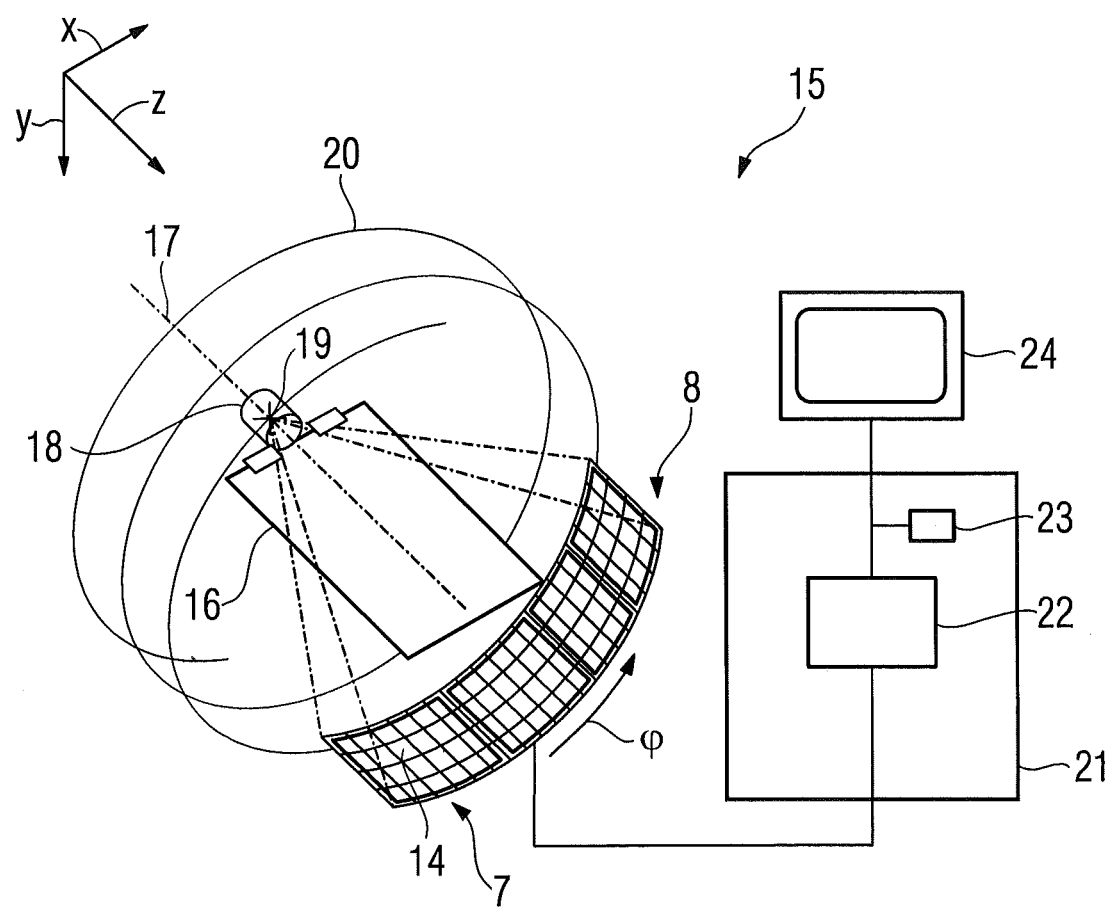
FIG. 1 shows a computed tomography apparatus comprising a radiation detector according to an embodiment of the invention in a schematic illustration.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In the figures, identical or functionally identical elements are designated by identical reference symbols. In the case of recurring elements in a figure, such as, for example, in the case of the radiation converter elements 14, only one element is respectively provided with a reference symbol for reasons of clarity. The illustrations in the figures are schematic and not necessarily true to scale, in which case scales can vary between the figures.

FIG. 1 illustrates a radiation detection device 15 in the form of a computed tomography apparatus in partly perspective, partly block-diagram-like view. The computed tomography apparatus 15 comprises a patient supporting couch 16 for supporting a patient to be examined. It furthermore comprises a gantry (not illustrated) with a recording system 18, 8 mounted such that it is rotatable about a system axis 17. The recording system 18, 8 has an X-ray tube 18 and a directly converting radiation detector 8 according to the invention, which are oriented opposite one another in such a way that an X-ray radiation emerging from the focus 19 of the X-ray tube 18 during operation impinges on the radiation detector 8. In this case, the radiation detector 8 has a plurality of radiation converters 7 according to the invention which are lined up in the $\phi$ direction and form modules and, for converting the radiation quanta arriving in the radiation converters 7, such as in the form of X-ray quanta, into electrical signals, have radiation converter elements 14 arranged in rows and in columns.

For recording a image of an examination region, upon rotation of the recording system 18, 8 about the system axis 17, projections from a multiplicity of different projection directions are detected, wherein, for each projection, the radiation detector 8 supplies a set of raw data from the electrical signals detected by the radiation converter elements 14. In the case of spiral scanning, by way of example, a continuous adjustment of the patient supporting couch 16 in the direction of the system axis 17 is effected simultaneously during a rotation of the recording system 18, 8. In the case of this type of scanning, therefore, the X-ray tube 18 and the radiation detector 8 move on a helical path 20 around the patient. The raw data generated in this way are serialized in a sequencer and subsequently transmitted to an image computer 21. The image computer 21 contains a reconstruction unit 22, which reconstructs from the raw data image data, e.g. in the form of a slice image of the patient, according to a method known per se to the person skilled in the art. The image data thus generated are stored in a memory 23 and can be displayed on a display unit 24, e.g. a video monitor, connected to the image computer 21.

Figure 2:
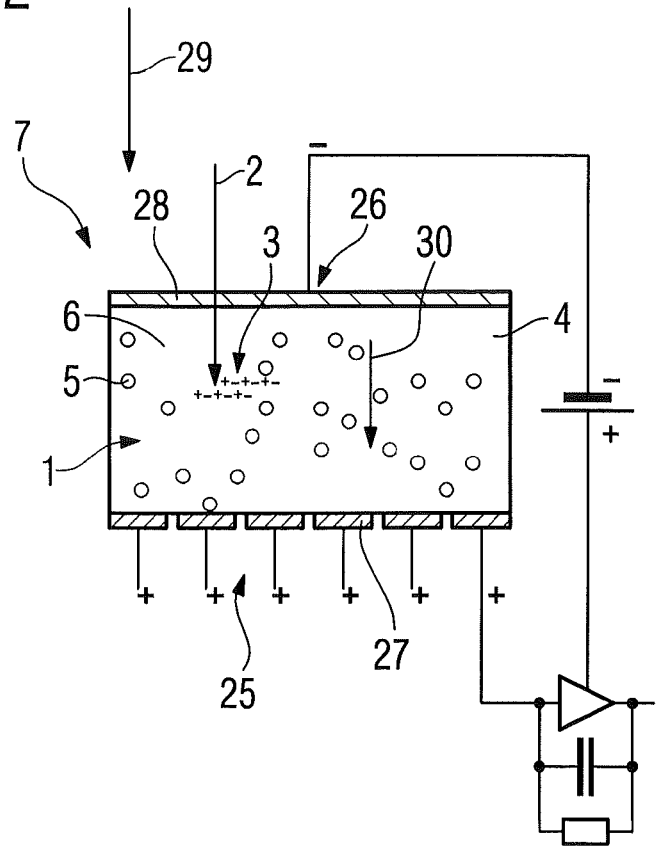
FIG. 2 shows a radiation detector according to an embodiment of the invention in side view.

The radiation converter 7 according to the invention is shown in a side view in FIG. 2 and comprises a radiation converter material 1, which enables a direct conversion of arriving X-ray quanta 2 into free electrical charge carriers 3. A plurality of pixel electrodes 27 are fitted on a first side 25 of the layer of the radiation converter material 1, which is also referred to hereinafter as the converter layer. The number of pixel electrodes 27 that is optimum in each case for a radiation converter 7 is dependent, inter alia, on the respectively desired spatial resolution, separation efficiency for the charge carriers and, of course, on the desired size of the radiation converter 7 per se. A counterelectrode 28 is arranged on a second side 26 of the converter layer, said second side lying opposite the first side 25. In the example shown, the counterelectrode 28 is embodied as an areal electrode. However, the counterelectrode 28 could also be configured in pixilated, strip-shaped and/or lattice-shaped fashion.

Other arrangements of the areal electrode 28 and of the pixel electrodes 27 are also conceivable. The electrodes could run for example in the converter layer parallel to the radiation incidence direction 29 or in a plane perpendicular to the first and second sides of the converter layer.

An arriving X-ray quantum generates free charge carriers 3 in the form of electron-hole pairs in part as a result of multi-staged physical exchange processes with the semiconductor material 4. A voltage applied to the two electrodes 27, 28 generates an electric field 30 in which the free charge carriers 3 are separated. In the present example, the pixel electrodes 27 are positively charged and the counterelectrode 28 is negatively charged. Accordingly, the liberated electrons are accelerated toward the pixel electrode 26, where they induce currents that are converted into an electrical signal.

The radiation converter materials 1 known previously were substantially always optimized with regard to only a single criterion. In this case, either it was attempted to minimize the degree of polarization or it was attempted to maximize the spectral sensitivity. Since the criteria compete with one another, an optimization of one criterion is always at the expense of the other criterion. Therefore, the realization of a radiation converter material 1 which is optimized both with regard to the degree of polarization and with regard to the spectral sensitivity is not possible, in principle. In the case of the method according to the invention, a compromise between these criteria has now been found which takes into account as well as possible the present characteristic of the quantum fluxes in human-medical examinations with regard to flux rate and spectral distribution of the arriving quantum events, such that the detected signals are particularly well suited to the reconstruction of an image.

Specifically, the radiation converter material 1 according to the invention comprises for this purpose a semiconductor material 4 having a dopant 5 in a predetermined dopant concentration and defect sites 6 produced in a process-dictated manner. In this case, the ratio between the concentrations of the dopant 5 and the defect sites 6 is chosen such that the semiconductor material has an ohmic resistivity in a range of between $5 \cdot 10^7$ $\Omega \cdot$cm and $2 \cdot 10^9$ $\Omega \cdot$cm, or better between $1 \cdot 10^8$ $\Omega \cdot$cm and $1 \cdot 10^9$ $\Omega \cdot$cm. In order to obtain a sufficiently good collecting quality of the radiation detector 8, the semiconductor material 4 additionally has a $\mu\tau$ product for positive charge carriers of greater than $5 \cdot 10^{-5}$ cm$^2$/V and for negative charge carriers of greater than $1 \cdot 10^{-3}$ cm$^2$/V. This is achieved by a CdTe semiconductor material being used as the semiconductor material 4. The dopant 5 introduced into the semiconductor material 4 comprises the element Cl in a dopant concentration of less than $5 \cdot 10^{17}$ atoms/cm$^3$. A comparably good result is obtained by using a CdZnTe semiconductor material.

Equally good results are obtained with the CdZnTe semiconductor material having a dopant 5 comprising the element In in a dopant concentration of less than $2 \cdot 10^{16}$ atoms/cm$^3$.

However, CdZnTe-, CdZnTeSe-, or CdMnTeSe-based semiconductor materials are also appropriate as further semiconductor materials 4. Alongside Cl and In, the following elements can furthermore be used by themselves or in combination in the case of the dopant 5: F, I, Al, Ga, Tl, Os, Ru, Fe. However, the impurities present in the semiconductor material can also form the dopant 5, said impurities representing a background doping.

Figure 3:
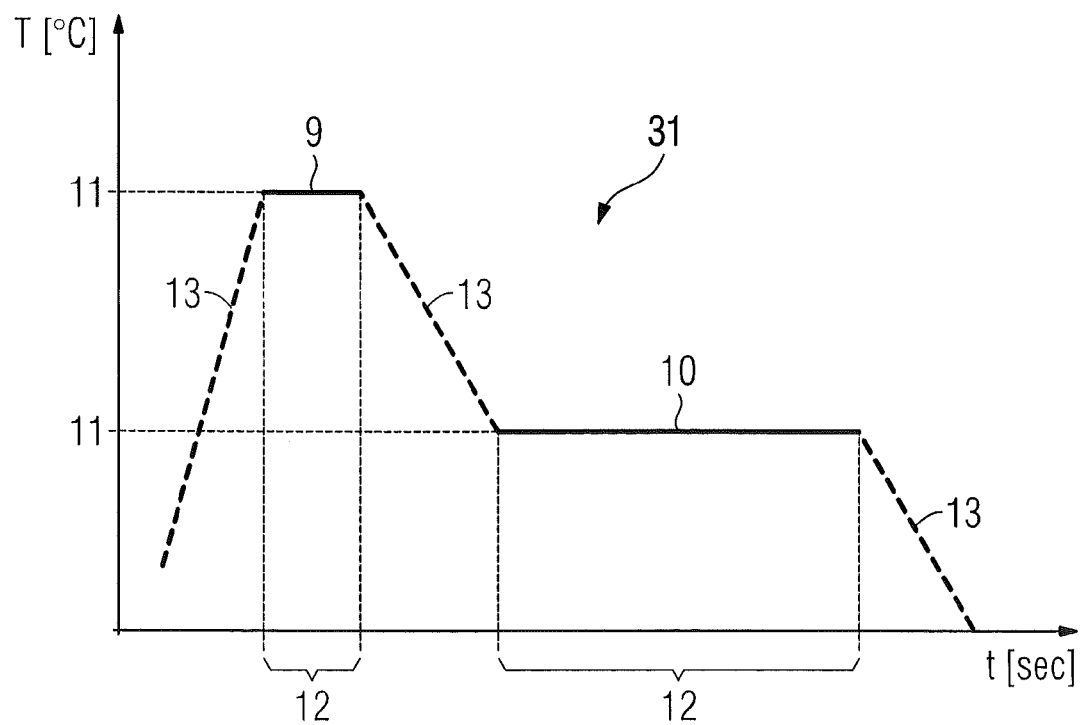
FIG. 3 shows a temperature profile during the heat treatment.

The concentration—present in the radiation converter material 1—of defect sites 6 for obtaining the ohmic resistivity sought and the $\mu\tau$ product sought is set in a targeted manner by means of a heat treatment. A temperature profile 31 of such a postprocessing can be seen in FIG. 3. In this case, depending on the dopant 5 and/or the dopant concentration, a heat treatment of the semiconductor material 4 is carried out in such a way that two temperature levels 9, 10 are traversed temporally. In this exemplary embodiment, the first temperature level 9 is set to a temperature of between 700° C. and 1050° C. and the second temperature level 10 is set to a temperature of between 300° C. and 420° C.

In this case, the position 11 of the temperature levels 9, 10, the time window 12 for the heat treatment at the temperature levels 9, 10, the surrounding atmosphere and a temperature gradient 13 for attaining one of the temperature levels 9, 10 are at least set as process parameters.

Further advantages of at least one embodiment of the invention can be seen in the following:
a) obtaining a good compromise between increasing the maximum detectable flux to at least $5 \cdot 10^8$ photons/mm$^2$*sec, better more than $1 \cdot 10^9$ photons/mm$^2$*sec, even better more than $2 \cdot 10^9$ photons/mm$^2$*sec, on the one hand, and an improved response and decay behavior of the detectors, i.e. shorter rise and fall times when counting the pulses or better temporal resolution of the X-ray or gamma radiation measurement, on the other hand,
b) ready availability of the semiconductor material,
c) use of standard growth technologies (e.g. Bridgman, THM, vapor deposition),
d) postprocessing that is easy to carry out,
e) installations and test methods for postprocessing are standard in the semiconductor industry and therefore readily accessible and inexpensive,
f) use of ohmic and Schottky contacts depending on the thickness of the detector is possible, and
g) capability of horizontally streaming together semiconducting detectors makes it possible to realize detector areas of almost any desired size.

To summarize, it can be stated that:

An embodiment of the invention relates to a radiation converter material 1 comprising a semiconductor material 4 used for directly converting radiation quanta 2 into electrical charge carriers 3, the semiconductor material having a dopant 5 in a predetermined dopant concentration and defect sites 6 produced in a process-dictated manner in such a way that the semiconductor material 4 has an ohmic resistivity in a range of between $5 \cdot 10^7$ $\Omega \cdot$cm and $2 \cdot 10^9$ $\Omega \cdot$cm. Such a radiation converter material 1 is particularly well matched to the requirements in particular in human-medical applications with regard to the high flux rate present and the spectral distribution of the radiation quanta 2. The invention additionally relates to a radiation converter 7 and a radiation detector 8, and a use of and a method for producing such a radiation converter material 1.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combineable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, non-transitory computer readable medium and non-transitory computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a non-transitory computer readable medium and is adapted to perform any one of the aforementioned methods when run on a computer device (a device including a processor). Thus, the non-transitory storage medium or non-transitory computer readable medium, is adapted to store information and is adapted to interact with a data processing facility or computer device to execute the program of any of the above mentioned embodiments and/or to perform the method of any of the above mentioned embodiments.

The non-transitory computer readable medium or non-transitory storage medium may be a built-in medium installed inside a computer device main body or a removable non-transitory medium arranged so that it can be separated from the computer device main body. Examples of the built-in non-transitory medium include, but are not limited to, rewriteable non-volatile memories, such as ROMs and flash memories, and hard disks. Examples of the removable non-transitory medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A radiation converter material, comprising:
a semiconductor material that directly converts radiation quanta into electrical charge carriers, said semiconductor material including a dopant in a dopant concentration and a plurality of defect sites at a ratio such that the semiconductor material includes an ohmic resistivity in a range of between $1 \cdot 10^8$ Ω·cm and $1 \cdot 10^8$ Ω·cm, wherein the plurality of defect sites are created defect sites located at a desired spatial position and in a desired amount.

2. The radiation converter material as claimed in claim 1, wherein the semiconductor material includes a µτ product for positive charge carriers of greater than $5 \cdot 10^{-5}$ cm$^2$/V and for negative charge carriers of greater than $1 \cdot 10^{-3}$ cm$^2$/V.

3. The radiation converter material as claimed in claim 1, wherein the semiconductor material is selected from the group consisting of CdTe, CdZnTe, CdZnTeSe and CdMnTeSe semiconductor material.

4. The radiation converter material as claimed in claim 1, wherein the dopant comprises an element or a combination of elements from the following group: F, Cl, I, Al, Ga, In, Tl, Os, Ru, Fe.

5. The radiation converter material as claimed in claim 1, wherein the semiconductor material is a CdTe or CdZnTe semiconductor material, and wherein the dopant comprises at least the one element Cl in a dopant concentration of less than $5 \cdot 10^{17}$ atoms/cm$^3$.

6. The radiation converter material as claimed in claim 1, wherein the semiconductor material is a CdZnTe semiconductor material, and wherein the dopant comprises at least the one element in a dopant concentration of less than $2 \cdot 10^{16}$ atoms/cm$^3$.

7. A radiation converter for CT systems, comprising a radiation converter material as claimed in claim 1.

8. A radiation detector for CT systems, comprising a radiation converter as claimed in claim 7.

9. A method, comprising:
providing a radiation converter material, as claimed in claim 1, to produce a radiation converter for CT systems.

10. A method for producing the radiation converter material of claim 1, in which a semiconductor material is used for directly converting radiation quanta into electrical charge carriers, the method comprising:
a) doping the semiconductor material with a dopant in a dopant concentration; and
b) effecting, depending on at least one of the dopant and the dopant concentration, a heat treatment of the semiconductor material for producing additional defect sites.

11. The method as claimed in claim 10, wherein the heat treatment is carried out such that a it product of the semiconductor material for positive charge carriers of greater than $5 \cdot 10^{-5}$ cm$^2$/V and for negative charge carriers of greater than $1 \cdot 10^{-3}$ cm$^2$/V is obtained.

12. The method as claimed in claim 10, wherein the semiconductor material used is selected from the group consisting of CdTe, CdZnTe, CdZnTeSe, and CdMnTeSe semiconductor material and the dopant used is an element or a combination of elements from the following group: F, Cl, I, Al, Ga, In, Tl, Os, Ru, Fe.

13. The method as claimed in claim 12, wherein the semiconductor material used is a CdTe or CdZnTe semiconductor material and the dopant used is at least the element Cl in a dopant concentration of less than $5 \cdot 10^{17}$ atoms/cm$^3$.

14. The method as claimed in claim 12, wherein the semiconductor material used is a CdZnTe semiconductor material and the dopant used is at least the element In in a dopant concentration of less than $2 \cdot 10^{16}$ atoms/cm$^3$.

15. The method as claimed in claim 10, wherein two temperature levels are traversed temporally for the heat treatment, and wherein at least one position of one of the temperature levels, a time window for the heat treatment at at least one of one of the temperature levels and a temperature gradient for attaining one of the temperature levels are set as process parameters.

16. The method as claimed in claim 15, wherein the first temperature level is set to a temperature of between 700° C. and 1050° C. and the second temperature level is set to a temperature of between 300° C. and 420° C.

17. The method as claimed in claim 11, wherein the semiconductor material used is selected from the group consisting of CdTe, CdZnTe, CdZnTeSe, and CdMnTeSe semiconductor material and the dopant used is an element or a combination of elements from the following group: F, Cl, I, Al, Ga, In, Tl, Os, Ru, Fe.

\* \* \* \* \*